(12) United States Patent
Cheah et al.

(10) Patent No.: US 12,275,041 B1
(45) Date of Patent: Apr. 15, 2025

(54) COVER PLATE FOR A POKA-YOKE BULK BIN SYSTEM

(71) Applicant: TEXAS INSTRUMENTS INCORPORATED, Dallas, TX (US)

(72) Inventors: Eng How Cheah, Melaka (ML); Kean Pin Ng, Kangar (ML)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/498,344

(22) Filed: Oct. 31, 2023

(51) Int. Cl.
*B65D 19/06* (2006.01)
*B07C 5/38* (2006.01)

(52) U.S. Cl.
CPC ............... *B07C 5/38* (2013.01); *B65D 19/06* (2013.01); *B65D 2519/00537* (2013.01); *B65D 2519/00796* (2013.01); *B65D 2585/86* (2013.01)

(58) Field of Classification Search
CPC .......... B65D 19/06; B65D 2519/00537; B65D 2519/00796; B65D 2585/86
USPC .......................................... 206/386; 220/1.5
See application file for complete search history.

(56) References Cited

U.S. PATENT DOCUMENTS

| | | | | | |
|---|---|---|---|---|---|
| 4,016,970 | A | * | 4/1977 | Wert | B65G 65/46 198/550.1 |
| 4,861,215 | A | * | 8/1989 | Bonerb | B60P 3/426 414/469 |
| 5,469,987 | A | * | 11/1995 | Honkawa | B65D 77/04 221/199 |

* cited by examiner

*Primary Examiner* — Jacob K Ackun
(74) *Attorney, Agent, or Firm* — Ronald O. Neerings; Frank D. Cimino

(57) ABSTRACT

One example includes a bulk bin system. The system includes a bin receptable comprising a first poka-yoke mating feature and a bulk bin configured to accommodate storage of bulk components. The bulk bin can be configured to rest on the bin receptacle and includes a second poka-yoke mating feature extending from an inner surface of the bulk bin. The second poka-yoke mating feature can be configured to engage with the first poka-yoke mating feature when the bulk bin is provided in the bin receptacle. The system further comprises a cover plate that is secured to the bulk bin via a securing feature. The cover plate includes a cover portion that extends along and is approximately aligned with the inner surface of the bulk bin to cover the second poka-yoke mating feature.

20 Claims, 14 Drawing Sheets

US 12,275,041 B1

COVER PLATE FOR A POKA-YOKE BULK BIN SYSTEM

TECHNICAL FIELD

This disclosure relates to fabrication and testing systems, and particularly to a cover plate for a poka-yoke bulk bin system.

BACKGROUND

Mass fabrication and testing systems are prone to human error. When fabricating a large number of components, particularly very small and/or very complicated components (e.g., integrated circuits (ICs)), it is often difficult to distinguish differences between the components. The difficulty in distinguishing differences between the components is especially pronounced when the components are subject to testing. For example, in fabrication and testing of ICs, an IC that passed an operational test may be visually indistinguishable from an IC that failed an operational test. The problem of being unable to easily distinguish between components of different conditions can be even more pronounced when the components are stored in bulk. To compensate for possible visual discrepancies between components, and to therefore mitigate human-error mistakes based on confusing different conditions of components, many sorting and/or storage systems implement a poka-yoke design. For example, a poke-yoke design may implement a physical difference in storage or sorting solutions to be able to quickly and visually distinguish between different conditions (e.g., accepted versus rejected) of different components.

SUMMARY

One example includes a bulk bin system. The system includes a bin receptable comprising a first poka-yoke mating feature and a bulk bin configured to accommodate storage of bulk components. The bulk bin can be configured to rest on the bin receptacle and includes a second poka-yoke mating feature extending from an inner surface of the bulk bin. The second poka-yoke mating feature can be configured to engage with the first poka-yoke mating feature when the bulk bin is provided in the bin receptacle. The system further comprises a cover plate that is secured to the bulk bin via a securing feature. The cover plate includes a cover portion that extends along and is approximately aligned with an inner surface of the bulk bin to cover the second poka-yoke mating feature.

Another example includes a method for implementing a bulk bin system. The method includes fabricating a cover plate, the cover plate comprising a cover portion and a securing feature and inserting the cover plate into a bulk bin that is configured to accommodate storage of bulk components. The bulk bin can include a first poka-yoke mating feature extending from an inner surface of the first end. The method also includes securing the cover plate to the bulk bin via the securing feature to provide that the cover portion extends along and is approximately aligned with an inner surface of the first end of the bulk bin to cover the first poka-yoke mating feature. The method further includes engaging the bulk bin with a bin receptacle, such that the first poka-yoke mating feature associated with the bulk bin engages with a second poka-yoke mating feature associated with the bin receptacle.

Another example includes a method for producing bulk components. The method includes providing a bulk bin system comprising a first bulk bin and a second bulk bin. The first bulk bin includes a poka-yoke mating feature. The method also includes securing a cover plate to the first bulk bin. The cover plate includes a cover portion and a securing feature. The cover portion can be approximately aligned with an inner surface of the first bulk bin to cover the poka-yoke feature. The method also includes fabricating the bulk components via fabrication equipment and performing a test on the fabricated bulk components via testing equipment. The method also includes determining first condition bulk components in response to a first portion of the fabricated bulk components exhibiting a first response to the test and determining second condition bulk components in response to a second portion of the fabricated bulk components exhibiting a second response to the test. The method further includes providing the first condition bulk components to the first bulk bin of the bulk bin system, and providing the second condition bulk components to the second bulk bin of the bulk bin system.

DETAILED DESCRIPTION

Figure 1:
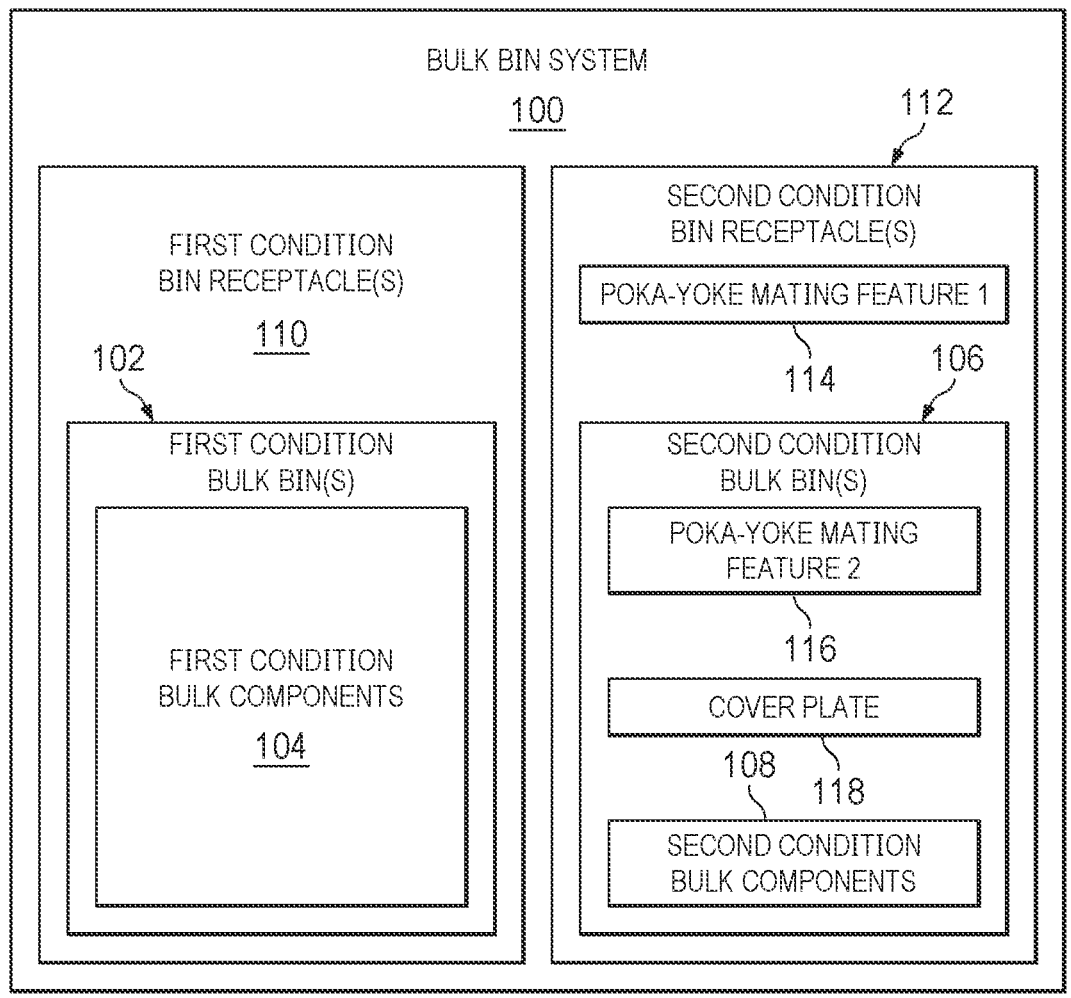
FIG. 1 is an example block diagram of a bulk bin system.

This disclosure relates to fabrication and testing systems, and particularly to a cover plate for a poka-yoke bulk bin system. The bulk bin system can include a plurality of bulk bins that are provided in respective bulk receptacles. The bulk bins can be configured to store bulk components (e.g., integrated circuits), and can be separated into groups that are each associated with different conditions of the bulk components. For example, one set of bulk bins can be associated with accepted components (e.g., having passed a product test), and another set of bulk bins can be associated with rejected components (e.g., having failed the product test). One of the sets of bulk bins and associated bin receptacles can implement poka-yoke mating features that are configured to allow operators to quickly and visually identify a difference between the first condition bulk components and the second condition bulk components in the respective bulk bins and bulk receptacles.

The poka-yoke mating features can be arranged as extending from surfaces inside the respective bulk bins and on a respective surface of the bin receptacle. For example, the bin receptacle can include a first poka-yoke mating feature that extends from a surface against which a bulk bin is to come in contact, and the bulk bin can include a second poka-yoke mating feature that extends from an inner surface of a sidewall of the bulk bin and is hollow, such that the first poka-yoke mating feature can be inserted into the second poka-yoke mating feature from the opposite surface of the sidewall of the bulk bin. Therefore, a bulk bin that does not have a second poka-yoke mating feature cannot be properly situated in or on a bin receptacle that includes a first poka-yoke mating feature. In this manner, bulk components of different conditions cannot be mixed up, thereby mitigating operator errors.

The poka-yoke mating features of the bulk bin system therefore cooperate to ensure that operator mistakes resulting from mixing bulk components of different conditions are mitigated. However, because the bulk components of the bulk bins of the bulk bin system can be manually dumped when full, the protrusion of the second poka-yoke mating feature from an internal surface of the respective bulk bin can result in bulk components being lodged or jammed inside the bulk bin. Because bulk bins can be heavy, and because such a problem can typically only be alleviated by completely overturning the bulk bin and/or striking the side of the bulk bin to dislodge the jammed bulk components, alleviating or preventing a jam of the bulk components under the poka-yoke mating feature can be physically onerous and/or time consuming for the operators.

To mitigate the jamming of bulk components in a bulk bin that includes a poka-yoke mating feature, a cover plate can be fabricated and inserted into the bulk bin to cover the poka-yoke mating feature. For example, the cover plate can include a cover portion and a securing feature. The cover portion can extend into an inner volume of a hollow recess of the bulk bin and can be aligned with the inner surface of the bulk bin from which the poka-yoke mating feature extends, thereby covering the poka-yoke mating feature and providing a smooth replacement interior surface of the bulk bin. The securing feature can secure the cover plate to a top edge of the bulk bin to provide stability and security of the cover plate within the bulk bin. Accordingly, when the bulk bin that includes the poka-yoke mating feature is filled, operators can manually dump the bulk bin without the risk of bulk components being jammed inside the bulk bin by getting stuck beneath the poka-yoke mating feature. As a result, the insertion of the cover plate into the bulk bin that includes the poka-yoke mating feature can result in a more time efficient and less physically demanding process for the operators.

FIG. 1 is an example block diagram of a bulk bin system 100. The bulk bin system 100 can be implemented in a fabrication environment in which bulk components are fabricated. The bulk components can be any of a variety of relatively small components that can be loosely sorted into bulk bins. In the example of FIG. 1, the bulk bins are demonstrated as at least one first condition bulk bin 102 that is configured to store first condition bulk components 104, and at least one second condition bulk bin 106 that is configured to store second condition bulk components 108.

As an example, the first condition bulk components 104 can correspond to bulk components that have exhibited a first response based on a test and the second condition bulk components 108 can correspond to bulk components that have exhibited a second response (e.g., opposite the first response) based on the test. For example, the bulk components can correspond to fabricated integrated circuits (ICs), and the test can correspond to one or more operational electrical tests of the ICs. Thus, one of the first and second condition bulk components 104 and 108 can correspond to accepted bulk components having passed the operational electrical test(s), and the other of the first and second condition bulk components 104 and 108 can correspond to rejected bulk components having failed the operational electrical test(s).

In the example of FIG. 1, the first condition bulk bin(s) 102 are demonstrated as being provided in (e.g., inserted in, slotted in, etc.) at least one first condition bin receptacle 110, and the second condition bulk bin(s) 106 are demonstrated as being provided in at least one second condition bin receptacle 112. For example, the bulk components can be sorted and provided in chutes, conveyors, or some other manner to the first condition bulk bin(s) 102 physically located in the first condition bin receptacle(s) 110 after exhibiting the first condition response, and to the second condition bulk bin(s) 106 physically located in the second condition bin receptacle(s) 112 after exhibiting the second condition response. In the example of FIG. 1, the second condition bin receptacle(s) 112 includes a first poka-yoke mating feature 114, and the second condition bulk bin(s) 106 includes a second poka-yoke mating feature 116.

The poka-yoke mating features 114 and 116 can be configured to mitigate operator errors in misidentification of first and second condition bulk components 104 and 108. For example, because the first condition bulk bin(s) 102 is configured to store the first condition bulk components 104 only, and the second condition bulk bin(s) 106 is configured to store the second condition bulk components 108 only, it is important for an operator to quickly and visually identify the difference between the first and second bulk components 104 and 108 so as to not mix the first and second bulk components 104 and 108 or misidentify the first and second bulk components 104 and 108. For example, accidentally packaging and shipping reject bulk components instead of accepted bulk components, conventionally known as Gross Test Escape (GET), could result in significant problems from a manufacturer/consumer relationship. Therefore, the poka-yoke mating features 114 and 116 can ensure that a given one of the first condition bulk bin(s) 102 cannot be inserted into one of the second condition bin receptacle(s) 110.

For example, the poka-yoke mating features 114 and 116 can be arranged as extending from cooperating surfaces associated with the respective second bin receptacle(s) 112 and second condition bulk bin(s) 106. As an example, the first poka-yoke mating feature 114 can extend from a surface of the bin receptacle(s) 112 against which the respective second bulk bin(s) 106 is to come in contact, and the second poka-yoke mating feature 116 can be hollow and can extend through an outer surface and from an inner surface of a sidewall of the second condition bulk bin(s) 106. Therefore, the first poka-yoke mating feature 114 can be inserted into the second poka-yoke mating feature 116 from the opposite surface of the sidewall of the second condition bulk bin(s) 106. Therefore, a first condition bulk bin 102 that does not have a second poka-yoke mating feature 116 cannot be properly situated in or on a second condition bin receptacle 110 that includes a first poka-yoke mating feature 114. In this manner, the first and second bulk components 104 and 108 cannot be mixed up, thereby mitigating operator errors, such as GTE. In addition to mitigating operator errors such as GTE, the second condition bulk bin(s) 106 can be configured to mitigate operator delays and potentially hazardous conditions associated with operators manually emptying the second condition bulk components 108, as described in greater detail herein.

Figure 2:
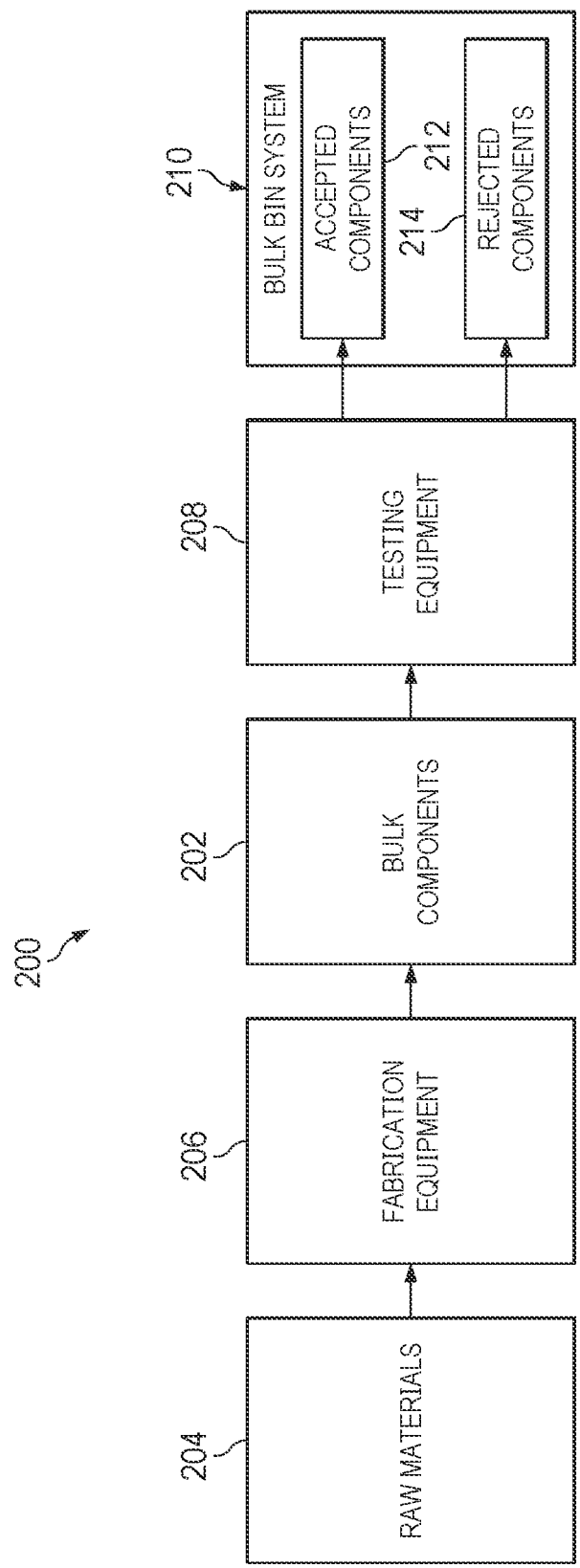
FIG. 2 is an example block diagram of a fabrication system.

FIG. 2 is an example block diagram of a fabrication system 200. The fabrication system 200 can be implemented in any of a variety of fabrication facilities in which bulk components, demonstrated in the example of FIG. 2 as bulk components 202, can be fabricated. As an example, the fabrication system 200 can be configured to fabricate the bulk components 202 as ICs.

In the example of FIG. 2, raw materials 204 are demonstrated as being provided to fabrication equipment 206. The raw materials 204 can correspond to any of a variety of raw materials required for the fabrication of the bulk components 202 (e.g., silicon, metal, etc.). The fabrication equipment 206 can correspond to any of a variety of machines, components, and processing devices that are implemented to fabricate the bulk components 202 (e.g., semiconductor fabrication equipment, lithography equipment, etc.). Therefore, the fabrication equipment 206 can fabricate the bulk components 202 (e.g., semiconductor devices) based on the raw materials 204.

The fabrication system 200 also includes testing equipment 208. The testing equipment 208 can be any of a variety of machines and devices that can implement the efficacy and/or operational characteristics of the bulk components 202. For example, the testing equipment 208 can include an electronic-testing device that can be implemented to conduct wafer-level and/or package-level electrical testing of the bulk components 202 configured as ICs. The bulk components 202 can be designated as accepted bulk components 210, and thus corresponding to first condition bulk components 210, in response to passing the tests, such as operating correctly under the predefined test conditions set by the testing equipment 208. Conversely, the bulk components 202 can thus be designated as rejected bulk components 212, and thus corresponding to second condition bulk components 212, in response to failing the tests, such as failing to operate correctly under the predefined test conditions set by the testing equipment 208.

The accepted and rejected bulk components 210 and 212 are provided to a bulk bin system 214. The bulk bin system 214 can correspond to the bulk bin system 100 in the example of FIG. 1. Thus, the bulk bin system 214 can include the first condition bulk bin(s) 102 and the second condition bulk bin(s) 106. While the bulk bin system 214 is demonstrated separately from the testing equipment 208, the bulk bin system 214 can be part of or coupled to the testing equipment 208, such that the accepted and rejected bulk components 210 and 212 can be provided to the bulk bin(s) 102 and 106 of the bulk bin system 214 in an automated manner.

As described above, the bulk bin system 214 can include the second condition bulk bin(s) 106, and can thus can also include the first poka-yoke mating feature 114. Thus, the bulk bin system 214 can be configured to accept only the second condition bulk bin(s) 106 in the second condition bin receptacle(s) 112 based on the first poka-yoke mating feature 114 and the respective second poka-yoke mating feature 116 associated with the second condition bulk bin(s) 106. For example, the second condition bulk bin(s) 106 of the bulk bin system 214 can be configured to store the rejected bulk components 212, such that the operators of the fabrication system 200 can quickly and visually distinguish between the accepted bulk components 210 and the rejected bulk components 212. Accordingly, operator errors resulting from confusing the accepted and rejected bulk components 210 and 212, such as GTE, can be mitigated as described above.

Referring back to the example of FIG. 1, when a given one of the first and second conditions bulk bin(s) 102 and 106 are filled, the respective one of the first and second conditions bulk bin(s) 102 and 106 can be manually dumped by the operators in the fabrication environment. However, the protrusion of the second poka-yoke mating feature 116 from the internal surface of the respective second condition bulk bin(s) 106 can result in the second condition bulk components 108 being lodged or jammed inside the respective second condition bulk bin(s) 106. Because bulk bins can be heavy (e.g., particularly when filled with bulk components), and because dislodging jammed bulk components can typically only be alleviated by completely overturning the respective second condition bulk bin(s) 106 and/or striking the side of the respective second condition bulk bin(s) 106 to dislodge the jammed second condition bulk components 108, alleviating or preventing a jam of the second condition bulk components 108 under the second poka-yoke mating feature 116 can be physically onerous and/or time consuming for the operators.

In the example of FIG. 1, the second condition bulk bin(s) 106 includes a cover plate 118. The cover plate 118 can be fabricated and inserted into the second condition bulk bin(s) 106 to cover the second poka-yoke mating feature 116 to mitigate the jamming of second condition bulk components 108 in the second condition bulk bin(s) 106. For example, the cover plate 118 can include a cover portion and a securing feature. The cover portion can extend into the interior volume of a hollow recess of the second condition bulk bin(s) 106 and can be aligned with the inner surface of the second condition bulk bin(s) 106 from which the second poka-yoke mating feature 116 extends, thereby covering the second poka-yoke mating feature 116 and providing a smooth replacement interior surface of the second condition bulk bin(s) 106. The securing feature can secure the cover plate 118 to a top edge of the second condition bulk bin(s) 106 to provide stability and security of the cover plate 118 within the second condition bulk bin(s) 106. As described herein, the "top edge of a bulk bin" refers to a top edge of one or more of the sidewalls (e.g., ends and/or sides) of the respective bulk bin that define the hollow recess of the respective bulk bin. Accordingly, when the second condition bulk bin(s) 106 that includes the second poka-yoke mating feature 116 is filled, operators can manually dump the second condition bulk components 108 out of the second condition bulk bin(s) 106 without the risk of the second condition bulk components 108 being jammed inside the second condition bulk bin(s) 106 by getting stuck beneath the second poka-yoke mating feature 116. As a result, the insertion of the cover plate 118 into the second condition bulk bin(s) 106 can result in a more time efficient and less physically demanding process for the operators to manually dump the second condition bulk bin(s) 106.

Figure 3A:
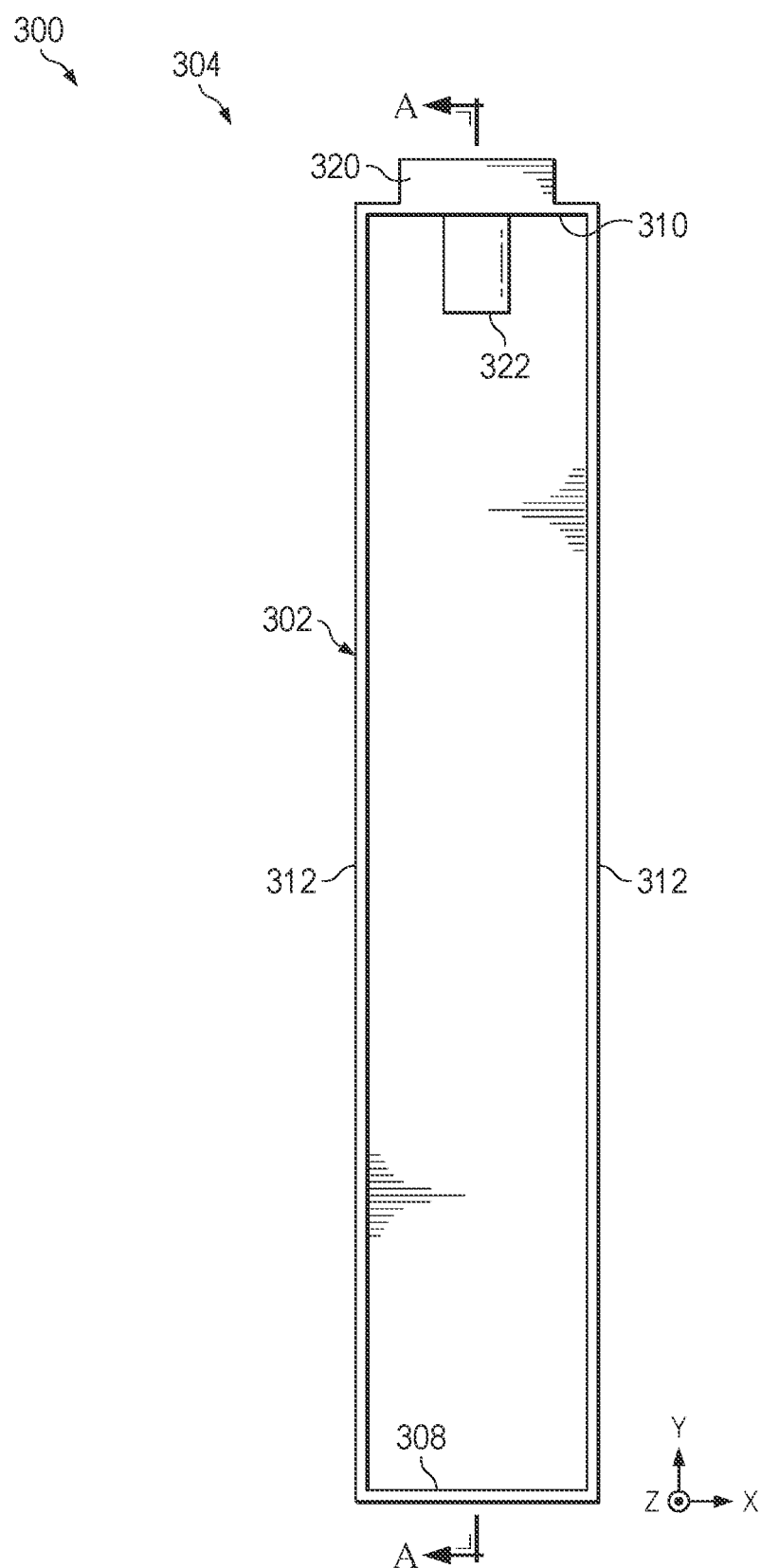
FIG. 3 is an example diagram of a bulk bin.
Figure 3B:
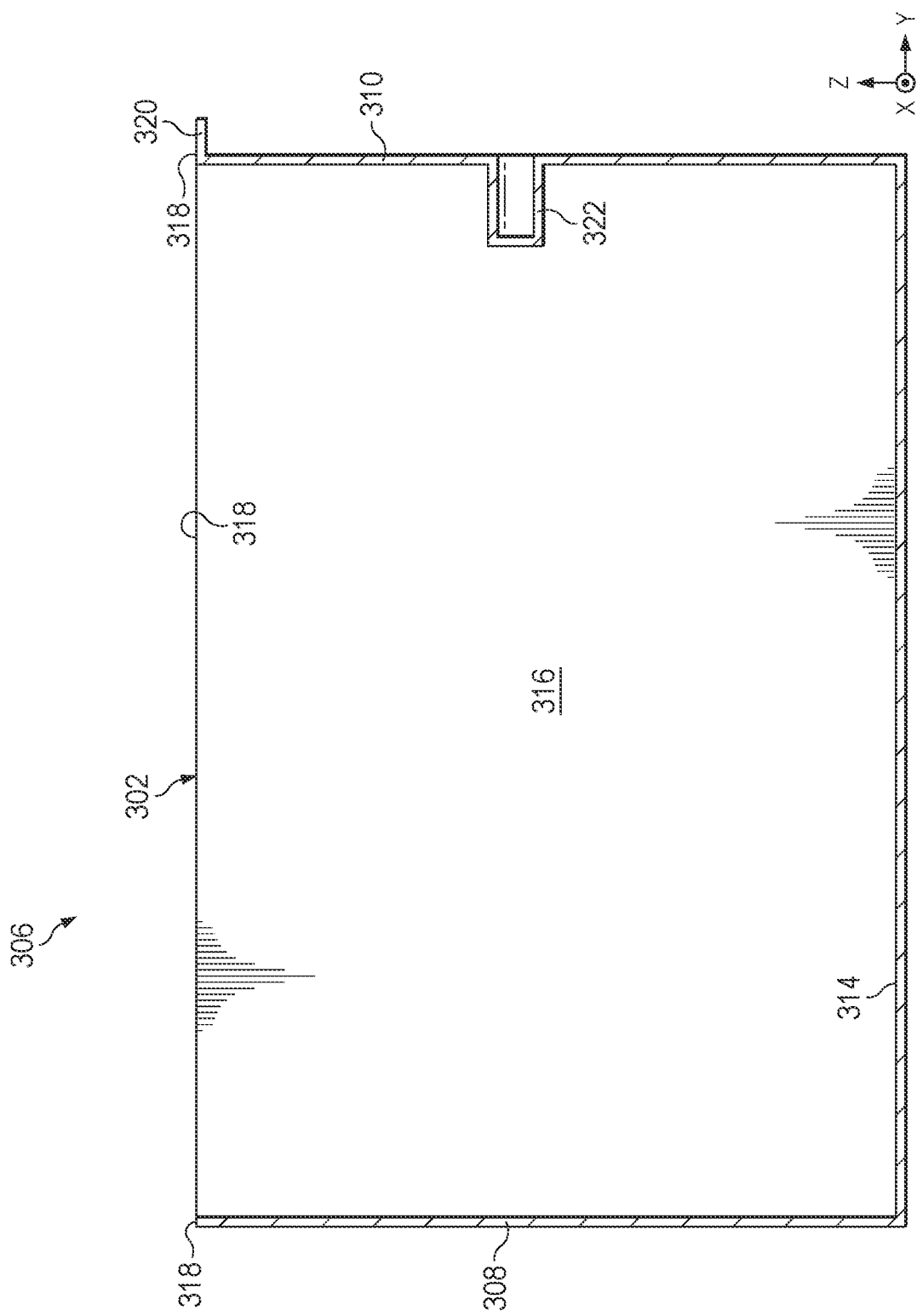

FIG. 3 is an example diagram 300 of a bulk bin 302. The bulk bin 302 is demonstrated in two separate views: a first view 304 that is an overhead plan view along the −Z axis, and a second view 306 that is a cross-sectional view of the plane "A" viewed along the −X axis. The bulk bin 302 can correspond to the second condition bulk bin(s) 106 in the example of FIG. 1. Therefore, reference is to be made to the example of FIG. 1 in the following description of the example of FIG. 3.

The bulk bin 302 includes a first end 308 and an opposing second end 310, a pair of opposing sidewalls 312, and a bottom 314. The first end 308, the second end 310, the opposing sidewalls 312, and the bottom 314 define a hollow recess 316 having an interior volume that is configured to accommodate the storage of the bulk components (e.g., the second condition bulk components 108). Each of the first end 308, the second end 310, and the opposing sidewalls 312 include a top edge 318 that surrounds the opening of the hollow recess 316. As an example, the bulk bin 302 can be formed from a sufficiently sturdy material, such as metal (e.g., steel), to provide durability of the bulk bin 302 in a fabrication environment. The bulk bin 302 also includes a handle 320 that extends from the top edge 318 of the exterior surface of the second end 310. The handle 320 can be configured to facilitate operator handling of the bulk bin 302.

The bulk bin 302 further includes a poka-yoke mating feature 322 that extends from an inner surface of the second end 310. The poka-yoke mating feature 322 is demonstrated in the example of FIG. 3 as a rod, such as having a circular cross-section, but can be any of a variety of shapes. The poka-yoke mating feature 322 can be fabricated to be a hollow recess that includes an opening in the outer surface of the second end 310. Therefore, the hollow poka-yoke mating feature 322 can be configured to accommodate a poka-yoke mating feature that extends from a surface of an associated bin receptacle (e.g., the second condition bin receptacle 112). The poka-yoke mating feature of the bin receptacle can thus be engaged (e.g., inserted into) the opening in the outer surface of the second end 310, thereby filling the hollow recess of the poka-yoke mating feature 322. Conversely, a bulk bin that does not include a poka-yoke mating feature, such as the poka-yoke mating feature 322, cannot engage a poka-yoke mating feature on the respective bin receptacle, and thus cannot be properly situated in the respective bin receptacle. Accordingly, only the bulk bin 302 having the poka-yoke mating feature 322 can be accommodated into a bin receptacle that has a corresponding poka-yoke mating feature, thereby mitigating operator mistakes such as GTE.

Figure 4:
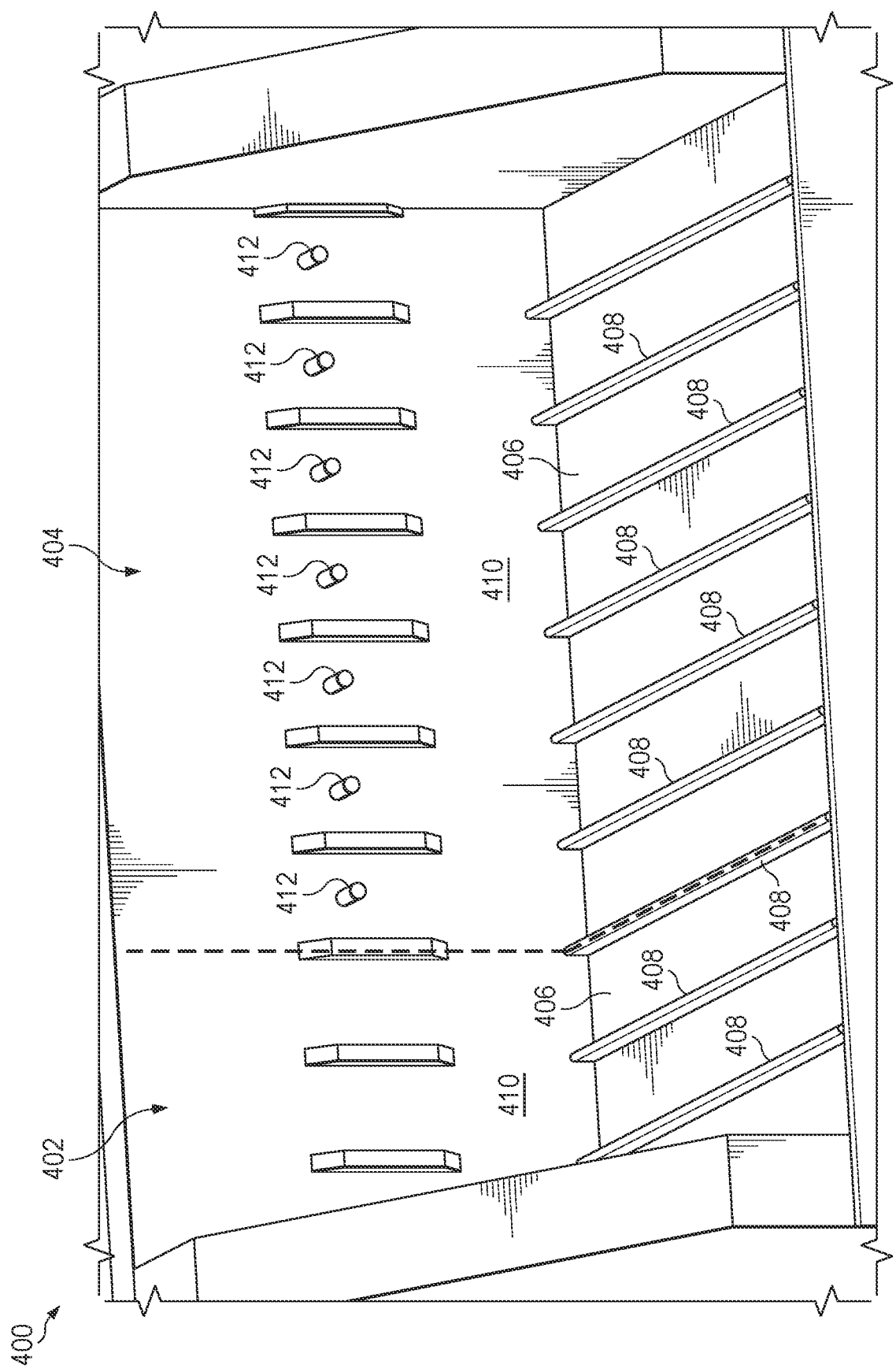
FIG. 4 is an example of a bin receptacle system.

FIG. 4 is an example diagram of a bin receptacle system 400. The bin receptacle system 400 can correspond to the first and second bin receptacle(s) 110 and 112 in the example of FIG. 1. Therefore, reference is to be made to the example of FIGS. 1 and 3 in the following description of the example of FIG. 4.

The bin receptacle system 400 includes a plurality of bin receptacles. Each of the bin receptacles can be configured to accommodate a respective bulk bin. The bin receptacle system 400 includes a first set of bin receptacles 402 that can correspond to first condition bin receptacles 110 and a second set of bin receptacles 404 that can correspond to second condition bin receptacles 112. Each of the bin receptacles 402 and 404 include a horizontal surface 406 on which an associated bulk bin can be provided, with grooves 408 extending from the horizontal surface 406 to divide a given one of the bin receptacles 402 and 404 from a neighboring one of the bin receptacles 402 and 404.

Each of the bin receptacles 402 and 404 also includes a second surface 410 that operates as a backstop for the respective associated bulk bins. Thus, bulk bins that are provided in the bin receptacles 402 and 404 can be provided between the grooves 408 on the horizontal surface 406 to slide along the horizontal surface 406 to engage the second surface 410. In the example of FIG. 4, the second surface 410 of each of the first set of bin receptacles 402 is completely flush (e.g., completely planar). However, the second surface 410 of each of the second set of bin receptacles 404 includes a poka-yoke mating feature 412 that extends from the second surface 410. Therefore, each of the first set of bin receptacles 402 can correspond to a respective one of the first condition bin receptacle(s) 110, and each of the second set of bin receptacles 404 can correspond to a respective one of the second condition bin receptacle(s) 112.

As described above with reference to the example of FIG. 3, the poka-yoke mating feature 322 in the bulk bin 302 can be fabricated to be a hollow recess that includes an opening in the outer surface of the second end 310. Therefore, the hollow poka-yoke mating feature 322 can be configured to accommodate the poka-yoke mating feature 412 that extends from the second surface 410 of a respective one of the bin receptacles 404. The poka-yoke mating feature 412 of the respective bin receptacle 404 can thus be engaged (e.g., inserted into) the opening in the outer surface of the second end 310 of the bulk bin 302, thereby filling the hollow recess of the poka-yoke mating feature 322. Conversely, a bulk bin that does not include the poka-yoke mating feature 322 cannot engage the poka-yoke mating feature 412 on the respective bin receptacle 404, and thus cannot be properly situated in the respective bin receptacle 404 (e.g., cannot engage the second surface 410). Accordingly, only the bulk bin 302 having the poka-yoke mating feature 322 can be accommodated into one of the bin receptacles 404 that has a corresponding poka-yoke mating feature 412, thereby mitigating operator mistakes such as GTE.

Figure 5A:
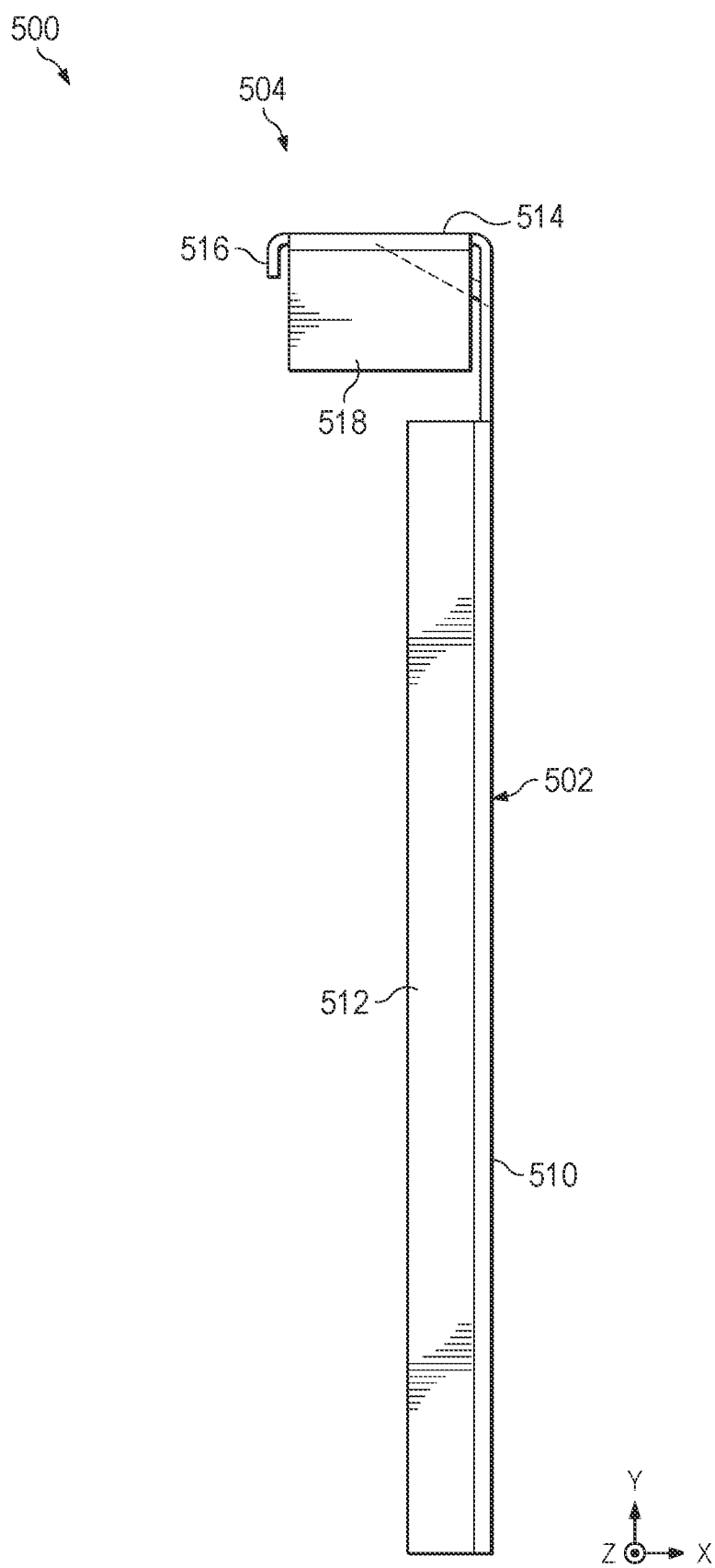
FIG. 5 is an example diagram of a cover plate.
Figure 5B:
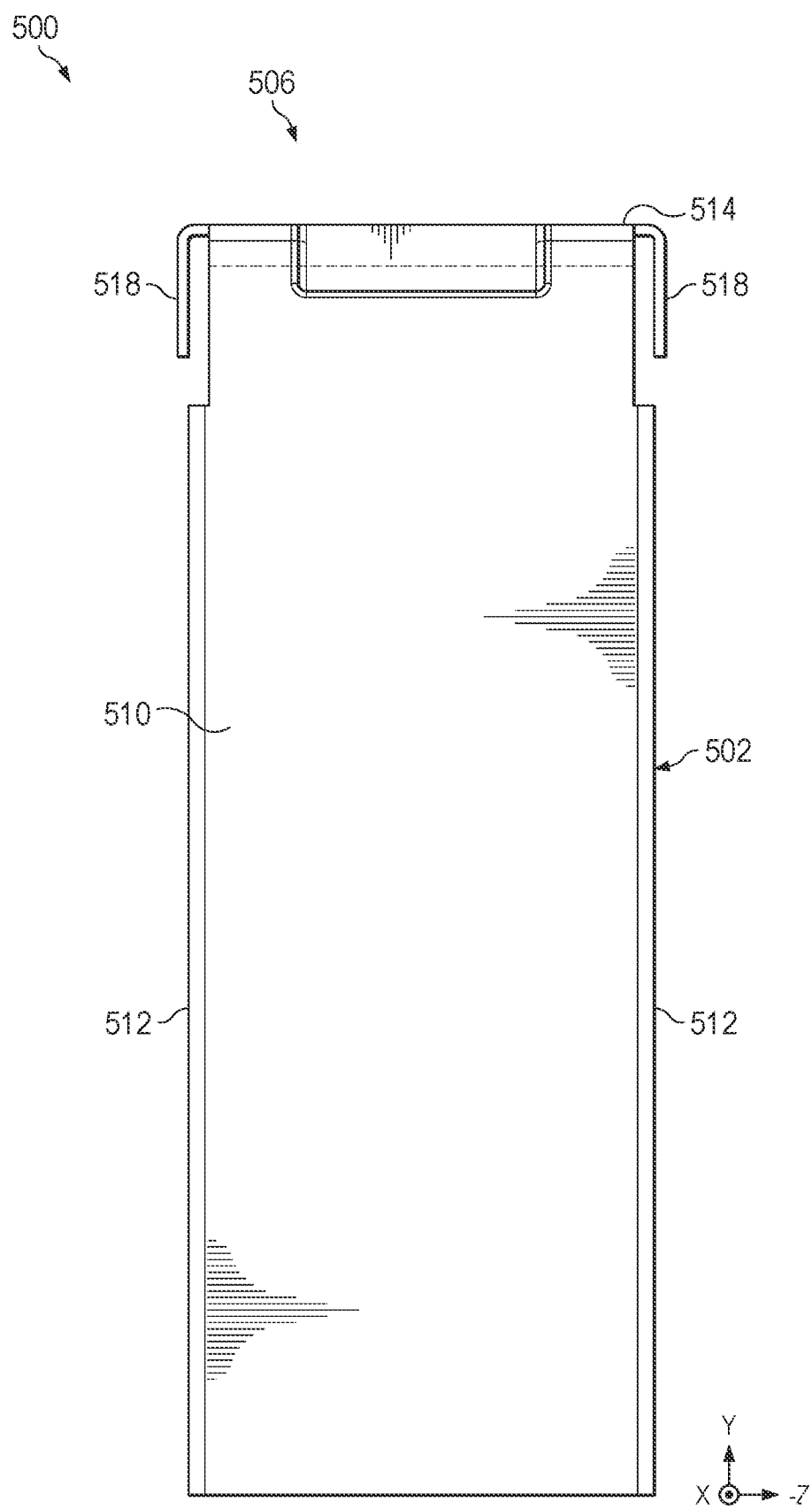
Figure 5C:
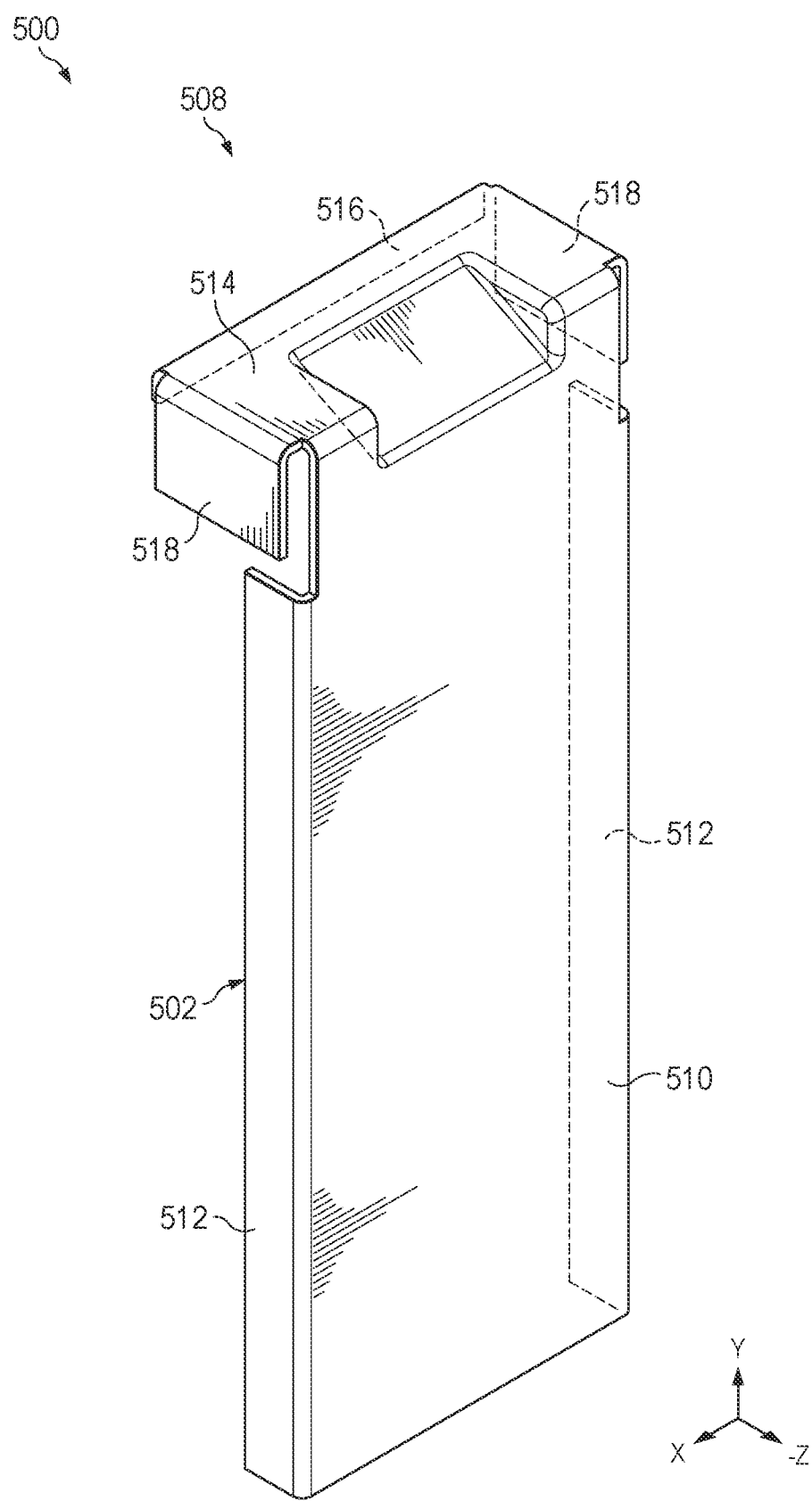

FIG. 5 is an example diagram 500 of a cover plate 502. The cover plate 502 is demonstrated in three separate views: a first view 504 along the −Z axis, a second view 506 along the −X axis, and a third view 508 corresponding to a perspective view. The cover plate 502 can correspond to the cover plate 118 in the example of FIG. 1, and can be fabricated to be accommodated in the bulk bin 302 in the example of FIG. 3. Therefore, reference is to be made to the examples of FIGS. 1, 3, and 4 in the following description of the example of FIG. 5.

The cover plate 502 includes a cover portion 510. The cover portion 510 is configured to extend into an inner volume of the hollow recess 316 formed by the opposing ends 308 and 310 and opposing sidewalls 312 of the bulk bin 302. The cover portion 510 can thus be approximately aligned with the interior surface of the second end 310 of the bulk bin 302, thereby covering the poka-yoke mating feature 322. As an example, the cover portion 510 can have dimensions that are approximately equal to (e.g., slightly less than) the depth of the hollow recess 316 (e.g., from the bottom 314 to the top edges 318) of the bulk bin 302. The cover portion 510 can have a width that is approximately equal to a width of the hollow recess 316 between the opposing sidewalls 312 of the bulk bin 302. Therefore, the cover portion 510 can have dimensions that are sufficient to mitigate gaps between the cover portion 510 and the bottom 314/sidewalls 312 of the bulk bin 302, thereby mitigating any of the bulk components from passing through and/or getting stuck between the cover portion 510 and the bottom 314/sidewalls 312 of the bulk bin 302. By covering the poka-yoke mating feature 322, the cover portion 510 of the cover plate 502 acts as a planar interior surface (as opposed to the non-planar protrusion of the poka-yoke mating feature 322) that mitigates jamming of bulk components in the hollow recess 316 of the respective bulk bin 302. As a result, the bulk bin 302 can be manually emptied (e.g., the bulk components manually dumped out of the bulk bin 302) without complete inversion of the bulk bin 302 and/or without having to strike the bulk bin 302 while holding of the heavy bulk bin 302 to dislodge the jammed bulk components. Accordingly, the bulk bin 302 can be emptied in a much more rapid and safe manner.

In the example of FIG. 3, the cover portion 510 also includes opposing side tabs 512 that extend from each opposing side and at least partially along a length of the cover portion 510. As an example, the side tabs 512 can be configured to provide contact pressure with an internal surface of the opposing sidewalls 312. The side tabs 512 can therefore provide a more secure fit of the cover plate 502 within the hollow recess 316 of the bulk bin 302.

The cover plate 502 also includes a transition portion 514 and a securing feature. The transition portion 514 can correspond to a portion of the cover plate 502 that interconnects the cover portion 510 and the securing feature. As described herein, the term "securing feature" corresponds to one or more features of the cover plate 502 that are configured to attach the cover plate 502 to at least one top edge 318 of the bulk bin 302, such as to secure the cover plate 502 to the bulk bin 302 in a manner that mitigates the cover plate 502 falling out of the bulk bin 302 while the bulk bin 302 is manually dumped. In the example of FIG. 5, the transition portion 514 extends from the cover portion 510 at an angle (e.g., a right angle) to facilitate dimensional fitting of the cover portion 510 in the interior of the hollow recess 316 of the bulk bin 302 while providing the securing feature to connect the cover plate 502 to the top edge(s) 318 of the bulk bin 302.

In the example of FIG. 5, the securing feature is represented by at least one lip 516 and a pair of opposing tabs 518. The lip(s) 516 extends at an angle (e.g., a right angle) from the transition portion 514 opposite the cover portion 510 to secure the cover plate 502 to the top edge 318 of the second end 310 of the bulk bin 302 through gravity. As another example, the lip(s) 516 can be provided at an acute angle from the transition portion 514, or can be curved, to engage with a mating lip at the top edge 318 of the second end 310 of the bulk bin 302. Similarly, the opposing tabs 518 each extend from opposite sides of the transition portion 514. The opposing tabs 518 can be configured to contact the top edges 318 of the pair of opposing sidewalls 312 of the respective bulk bin 302 and extend along an external surface of each of the opposing sidewalls 312 of the bulk bin 302. As an example, the opposing tables 518 can be sufficiently dimensioned to provide pressure on the opposing sidewalls 312 (e.g., on just the exterior surfaces of the opposing sidewalls 312, or between the opposing tabs 518 and the cover portion 510), such as to mitigate slipping of the cover plate 502 from the secure position of the cover plate 502 in and/or on the bulk bin 302. Accordingly, the opposing tabs 518 can provide increased stability of the securing of the cover plate 502 to the bulk bin 302, such as when the bulk bin 302 is empty.

The cover plate 502 can be fabricated in any of a variety of ways. As an example, the cover plate 302 can be fabricated as a flat stenciled sheet of a rigid material (e.g., steel or aluminum) and can be bent to form the cover portion 510 (e.g., including the side tabs 512), the transition portion 514, and the securing feature (e.g., the lip(s) 516, the opposing tabs 518). For example, the flat stenciled shape of the cover plate 302 can be cut from a material sheet via any of a variety of ways (e.g., laser-cutting, water-cutting, punch-pressing, etc.), and can be bent in any of a variety of machining processes. As another example, the cover plate 302 can be formed from other processes, such as injection molding, additive manufacturing, or any of a variety of other processes.

FIGS. 6-9 demonstrate an example of implementation of a bulk bin system. The bulk bin system in the examples of FIGS. 6-9 can correspond to one of the second condition bulk bin(s) 102 and one of the second condition bin receptacle(s) 112. Therefore, reference is to be made to the examples of FIGS. 1 and 2-5 in the following description of the examples of FIGS. 6-9. Like reference numbers are used throughout the examples of FIGS. 6-9.

Figure 6:
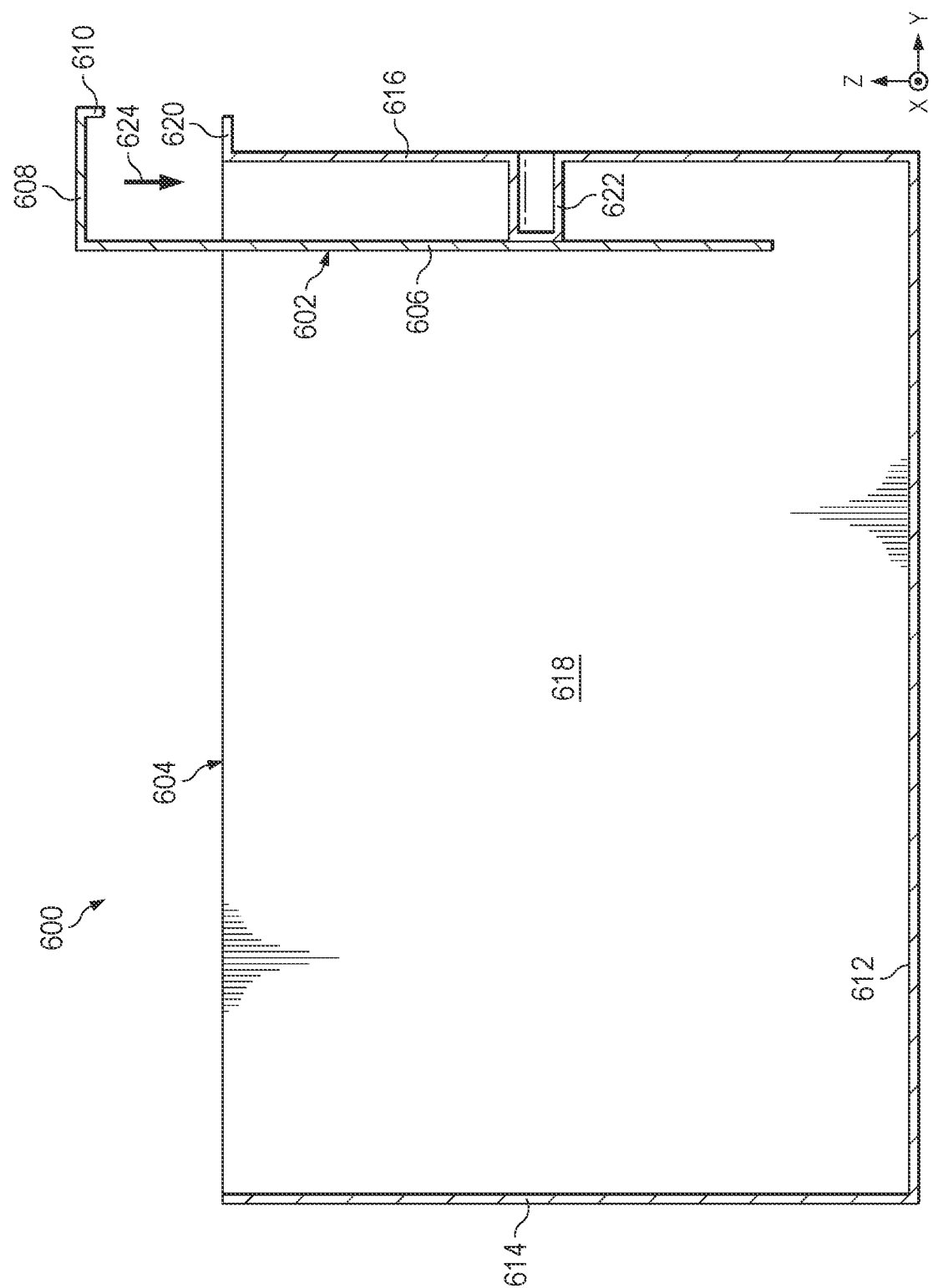
FIG. 6 is an example diagram of inserting a cover plate into a bulk bin.

FIG. 6 is an example diagram 600 of inserting a cover plate 602 into a bulk bin 604. The cover plate 602 can correspond to the cover plate 502 and the bulk bin 604 can correspond to the bulk bin 302. In the example of FIG. 6, the cover plate 602 is demonstrated in a cross-sectional side view, similar to the second view 506 in the example of FIG. 5. Therefore, the cover plate 602 is demonstrated without the side tabs 512 or the opposing tabs 518 of the securing feature. However, the cover plate 602 does include a cover portion 606, a transition portion 608, and a lip 610 that can be or can be part of the securing feature of the cover plate 602. The bulk bin 604 is demonstrated the same as the second view 306 in the example of FIG. 3. The bulk bin 604 includes a bottom 612, a first end 614, a second end 616, a hollow recess 618, a handle 620, and a poka-yoke mating feature 622. The diagram 600 thus demonstrates insertion of the cover plate 602 into the bulk bin 604, as demonstrated by an arrow 624.

Figure 7:
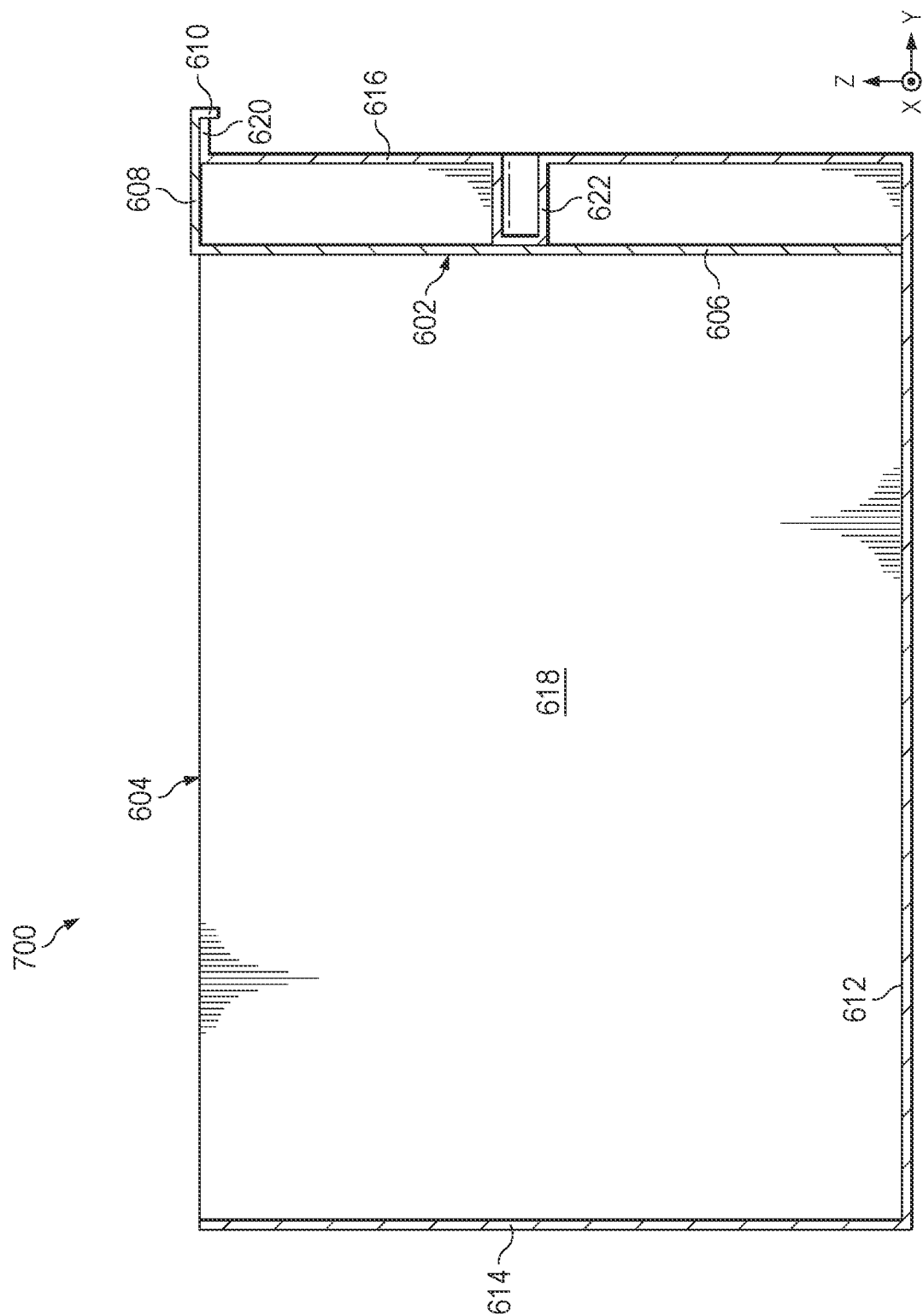
FIG. 7 is an example diagram of a bulk bin with a cover plate.

FIG. 7 is an example diagram 700 of the bulk bin 604 with the installed cover plate 602. The cover plate 602 is demonstrated such that the lip 610 is engaged with the handle 620 to secure the cover plate 602 within the bulk bin 604 (e.g., in cooperation with the opposing tabs 518). In the example of FIG. 7, the cover portion 606 is demonstrated as being approximately flush with the end of the poka-yoke mating feature 622, and is thus covering the poka-yoke mating feature 622 in a manner that maximizes the volume of the hollow recess 618. The length of the cover portion 606 is demonstrated as extending to be approximately flush with the bottom 612 (e.g., and the width of the cover portion 606 can be approximately flush with the inner surfaces of the sidewalls 312). Therefore, the cover portion 606 can provide a planar surface in the interior of the bulk bin 604 to mitigate the occurrence of bulk components getting stuck beneath the poka-yoke mating feature 622.

Figure 8:
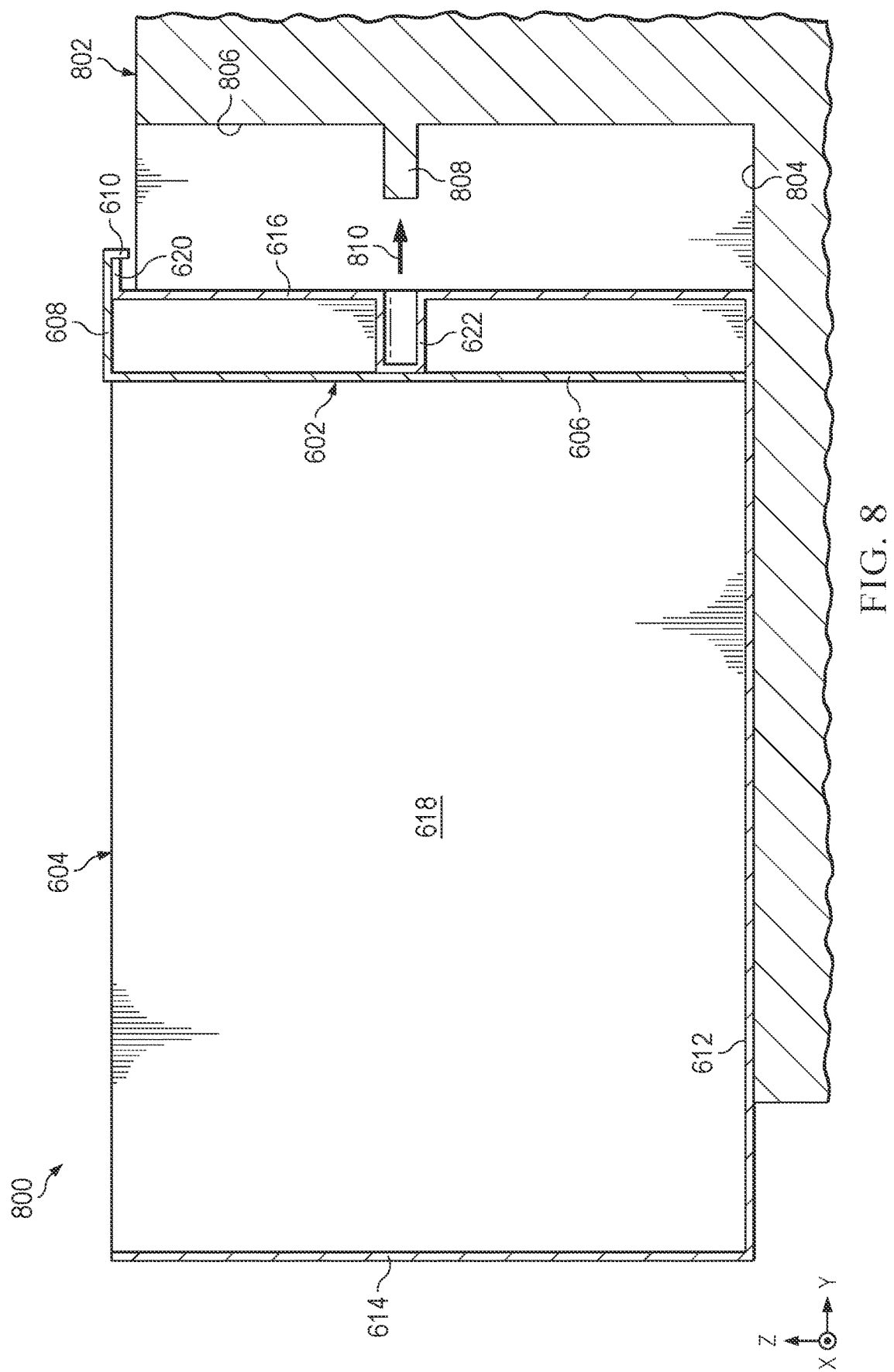
FIG. 8 is an example diagram of inserting a bulk bin into a bin receptacle.

FIG. 8 is an example diagram 800 of inserting the bulk bin 604 into a bin receptacle 802. The bin receptacle 802 can correspond to a cross-sectional view of one of the bin receptacles 404 in the example of FIG. 4. The bin receptacle 802 includes a first surface 804, a second surface 806, and a poka-yoke mating feature 808 that extends from the second surface 806. In the example of FIG. 8, the bulk bin 604 is provided on the first surface 804 of the bin receptacle 802 and is slid along the first surface 804, as demonstrated by arrows 810, until the second end 616 engages with the second surface 806. In this manner, the poka-yoke mating feature 808 engages with the poka-yoke mating feature 622, such that the poka-yoke mating feature 808 is inserted into the hollow recess of the poka-yoke mating feature 622.

Figure 9:
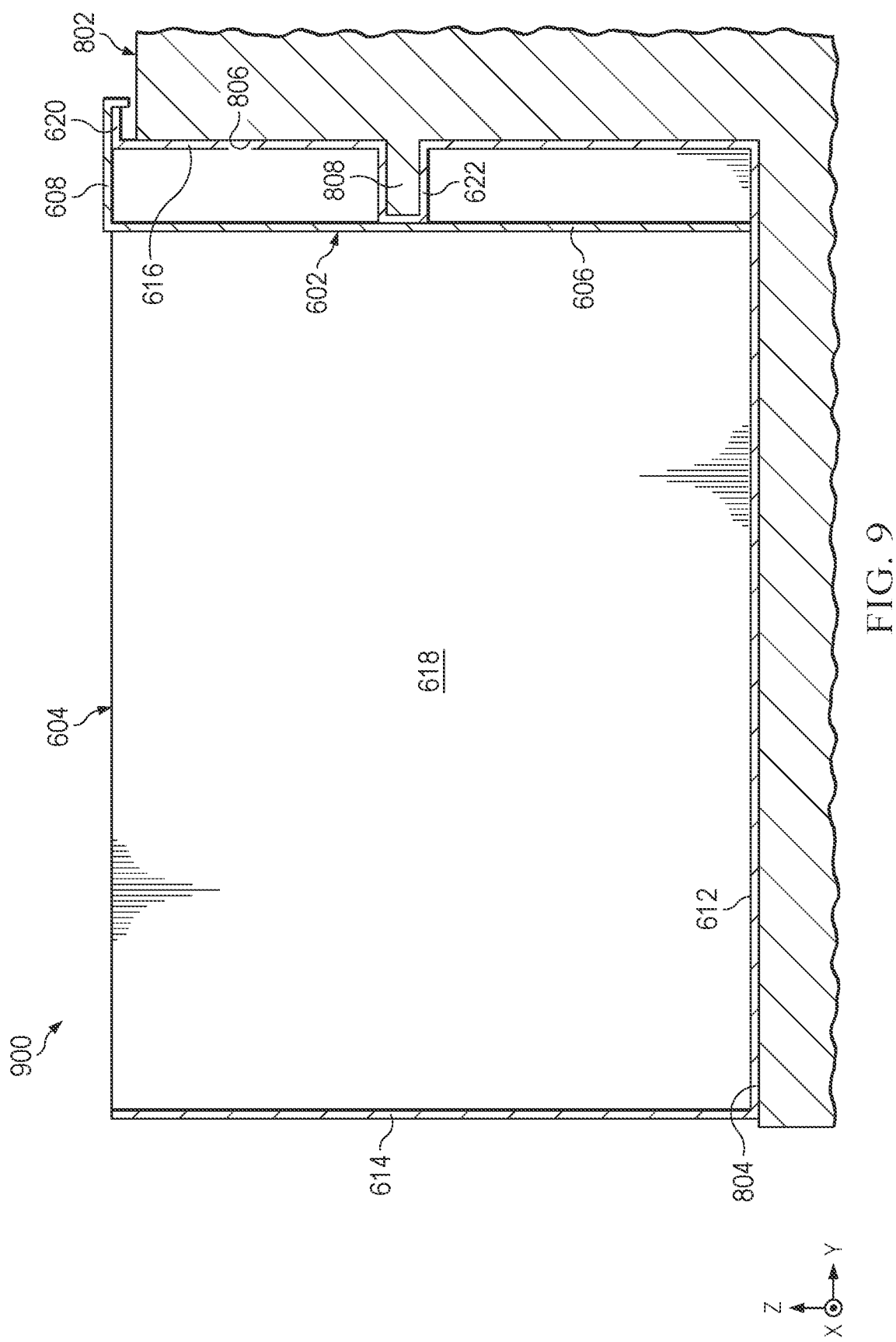
FIG. 9 is an example diagram of a bulk bin system.

FIG. 9 is an example diagram of a bulk bin system 900. The bulk bin system 900 is demonstrated as the cover plate 602 fully secured in the bulk bin 604, and the bulk bin 604 properly positioned in the bin receptacle 802. The proper positioning of the bulk bin 604 in the bin receptacle 802 is demonstrated by engagement of the poka-yoke mating feature 808 within the poka-yoke mating feature 622, and thus the ability to provide the exterior surface of the second end 616 of the bulk bin 604 to be approximately flush against the second surface 806 of the bin receptacle 802. The arrangement of the poka-yoke mating features 622 and 808 thus allows the poka-yoke mating features 622 and 808 to cooperate to mitigate operator errors associated with mixing bulk components, as described above. Particularly, absent the poka-yoke mating feature 622 (e.g., for a first condition bulk bin 102), the bulk bin 604 could not be properly positioned on the bin receptacle 802 to provide the second end 616 to be approximately flush with the second surface 806. Such lack of capability of proper positioning can be easily and visually identified by operators to prevent confusion of conditions of bulk components, such as GTE.

In the example of FIG. 9, the bulk bin system 900 is arranged such that the bulk bin 604 can be filled with bulk components (e.g., the second condition bulk components 108). Based on the cover plate 602 covering the poka-yoke mating feature 622, the bulk bin 604 can be subsequently dumped when filled with the bulk components without bulk components getting stuck or jammed therein. Accordingly, the bulk bin 604 can be emptied in a timelier manner and without providing physical strain, as opposed to a typical bulk bin in which the bulk components can be jammed beneath the poka-yoke mating feature.

Figure 10:
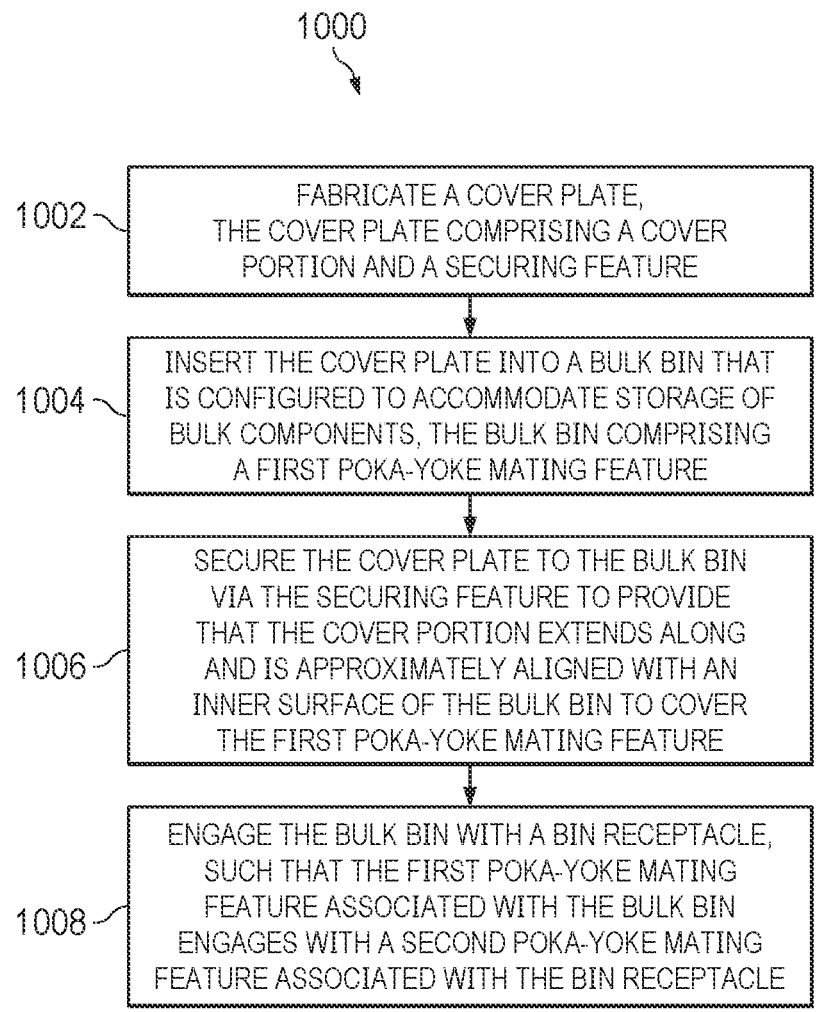
FIG. 10 is an example of a method for implementing a bulk bin system.
Figure 11:
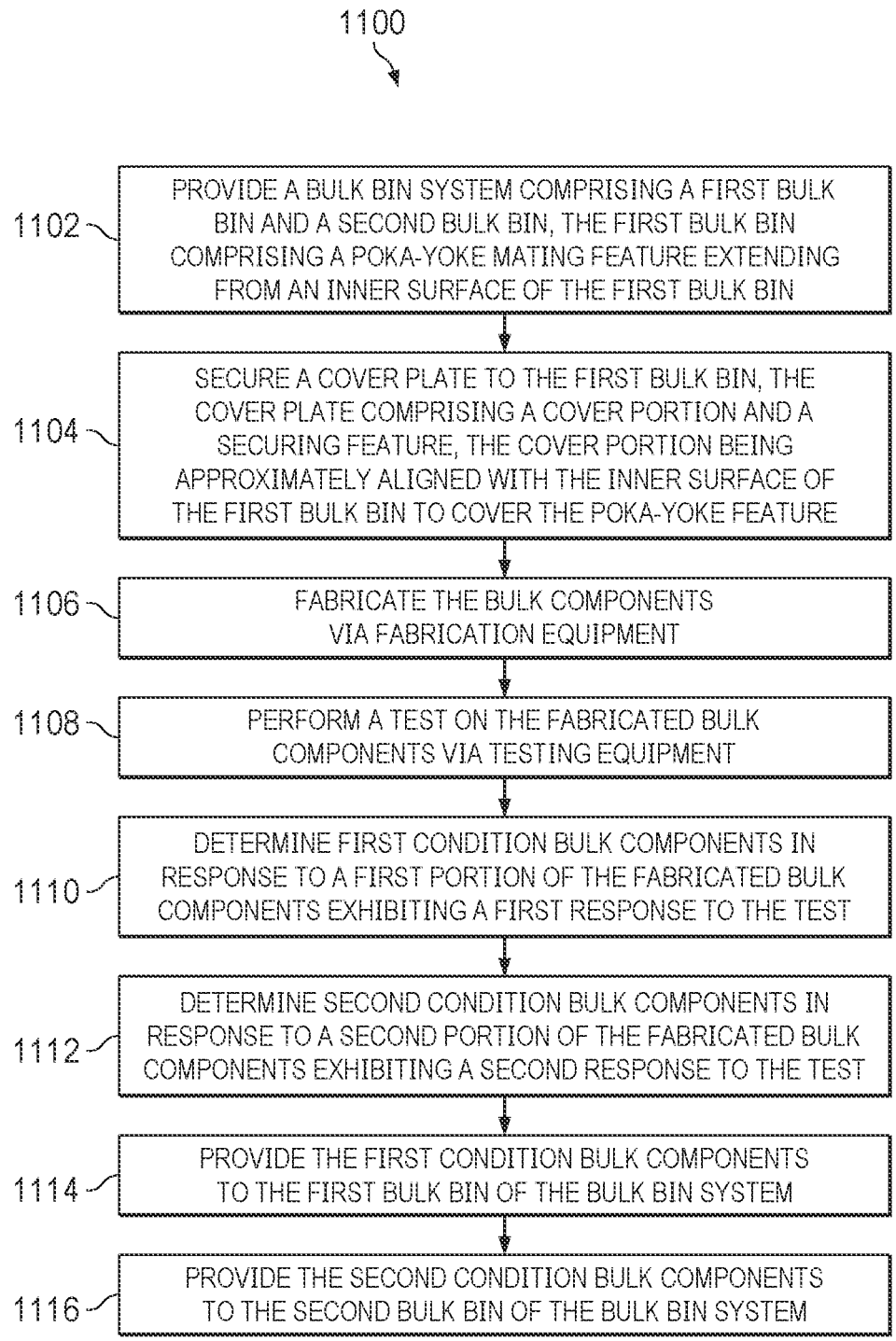
FIG. 11 is an example of a method for producing bulk components.

In view of the foregoing structural and functional features described above, methodologies in accordance with various aspects of the disclosure will be better appreciated with reference to FIGS. 10 and 11. It is to be understood and appreciated that the methods of FIGS. 10 and 11 are not limited by the illustrated order, as some aspects could, in accordance with the present disclosure, occur in different orders and/or concurrently with other aspects from that shown and described herein. Moreover, not all illustrated features may be required to implement the methodologies in accordance with an aspect of the present examples.

FIG. 10 illustrates an example of a method 1000 for implementing a bulk bin system (e.g., the bulk bin system 100). At 1002, a cover plate (e.g., the cover plate 118) comprising a cover portion (e.g., the cover portion 510) and a securing feature is fabricated. At 1004, the cover plate is inserted into a bulk bin (e.g., the second condition bulk bin(s) 106) that is configured to accommodate storage of bulk components (e.g., the second condition bulk components 108), the bulk bin comprising a first poka-yoke mating feature (e.g., the poka-yoke mating feature 116). At 1006, the cover plate is secured to the bulk bin via the securing feature to provide that the cover portion extends along and is approximately aligned with an inner surface of the bulk bin to cover the first poka-yoke mating feature. At 1008, the bulk bin is engaged with a bin receptacle (e.g., the second condition bin receptacle(s) 112), such that the first poka-yoke mating feature associated with the bulk bin engages with a second poka-yoke mating feature (e.g., the poka-yoke mating feature 114) associated with the bin receptacle.

FIG. 11 illustrates an example of a method 1100 for producing bulk components (e.g., the bulk components 202). At 1102, a bulk bin system comprising a first bulk bin (e.g., the first condition bulk bin(s) 102) and a second bulk bin (e.g., the second condition bulk bin(s) 106) is provided, the first bulk bin comprising a poka-yoke mating feature (e.g., the poka-yoke mating feature 116) extending from an inner surface of the first bulk bin. At 1104, a cover plate (e.g., the cover plate 118) is secured to the first bulk bin, the cover plate comprising a cover portion (e.g., the cover portion 510) and a securing feature, the cover portion being approximately aligned with the inner surface of the first bulk bin to cover the poka-yoke feature. At 1106, the bulk components are fabricated via fabrication equipment (e.g., the fabrication equipment 206). At 1108, a test is performed on the fabricated bulk components via testing equipment (e.g., the testing equipment 208). At 1110, first condition bulk components (e.g., the first condition bulk components 104) are determined in response to a first portion of the fabricated bulk components exhibiting a first response to the test (e.g., pass the test). At 1112, second condition bulk components (e.g., the second condition bulk components 108) are determined in response to a second portion of the fabricated bulk components exhibiting a second response to the test (e.g., fail the test). At 1114, the first condition bulk components are provided to the first bulk bin of the bulk bin system. At 1116, the second condition bulk components are provided to the second bulk bin of the bulk bin system.

In this description, the term "couple" can cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, a device that is "configured to" perform a task or function can be configured (e.g., programmed and/or hardwired) at a time of manufacturing by a manufacturer to perform the function and/or can be configurable (or reconfigurable) by a user after manufacturing to perform the function and/or other additional or alternative functions. The configuring can be through firmware and/or software programming of the device, through a construction and/or layout of hardware components and interconnections of the device, or a combination thereof. Furthermore, a circuit or device that is described herein as including certain components can instead be configured to couple to those components to form the described circuitry or device. For example, a structure described herein as including one or more semiconductor elements (such as transistors), one or more passive elements (such as resistors, capacitors, and/or inductors), and/or one or more sources (such as voltage and/or current sources) can instead include only the semiconductor elements within a single physical device (e.g., a semiconductor die and/or integrated circuit (IC) package) and can be configured to couple to at least some of the passive elements and/or the sources to form the described structure, either at a time of manufacture or after a time of manufacture, such as by an end-user and/or a third-party.

The phrase "based on" means "based at least in part on". Therefore, if X is based on Y, X can be a function of Y and any number of other factors.

Modifications are possible in the described embodiments, and other embodiments are possible, within the scope of the claims.

What is claimed is:

1. A bulk bin system comprising:
   a bin receptacle comprising a first poka-yoke mating feature;
   a bulk bin configured to accommodate storage of bulk components, the bulk bin being configured to rest on the bin receptacle and comprising a second poka-yoke mating feature extending from an inner surface of the bulk bin, the second poka-yoke mating feature being configured to engage with the first poka-yoke mating feature when the bulk bin is provided in the bin receptacle; and
   a cover plate that is secured to the bulk bin via a securing feature, the cover plate comprising a cover portion that extends along and is approximately aligned with an inner surface of the bulk bin to cover the second poka-yoke mating feature.

2. The system of claim 1, wherein the cover portion of the cover plate has a width that extends approximately fully between a pair of opposing sidewalls of the bulk bin, and has a length that extends to a bottom surface of the bulk bin when secured.

3. The system of claim 2, wherein the cover portion comprises opposing side tabs that extend along a length of the cover portion and are configured to provide contact pressure with an internal surface of the pair of opposing sidewalls.

4. The system of claim 1, wherein the securing feature engages with a top edge of the bulk bin to allow the cover portion to hang from the top edge of the bulk bin.

5. The system of claim 1, wherein the cover plate further comprises a transition portion that interconnects the cover portion and the securing feature and extends at a non-zero degree angle from the cover portion.

6. The system of claim 5, wherein the securing feature comprises at least one lip that extends from the transition portion opposite the cover portion to secure the cover plate to the top edge of the bulk bin through gravity.

7. The system of claim 5, wherein the securing feature comprises a pair of opposing tabs that each extend from opposite sides of the transition portion, the opposing tabs being configured to contact a top edge of a respective pair of opposing sidewalls of the bulk bin and to extend along an external surface of each of the pair of opposing sidewalls of the bulk bin to provide stability of the securing of the cover plate to the bulk bin when the bulk bin is empty.

8. The system of claim 5, wherein the cover plate is fabricated as a flat stenciled sheet of a rigid material that is bent at portions to form the cover portion, the transition portion, and the securing feature.

9. The system of claim 1, wherein the bin receptable comprises a first surface and a second surface, the first surface being approximately horizontal and the second surface extending from the first surface at an angle, wherein the first poka-yoke mating feature extends from the second surface, wherein the bulk bin comprises a bottom, a first end, a second end opposite the first end, and a pair of sidewalls that extend between the first and second ends, wherein the bottom, the first and second ends, and the pair of sidewalls each have a top edge and collectively cooperate to define a hollow recess configured to accommodate storage of bulk components, wherein the second poka-yoke mating feature extends from an internal surface of the second end, wherein the bulk bin is configured to rest on the first surface of the bin receptacle, wherein the second poka-yoke mating feature is configured to engage with the first poka-yoke mating feature when the first end of the bulk bin is provided proximal to or in contact with the second surface of the bin receptacle.

10. The system of claim 9, wherein the cover plate is secured to the top edge of at least one of the second end and the pair of sidewalls of the bulk bin.

11. A method for implementing a bulk bin system, the method comprising:
fabricating a cover plate, the cover plate comprising a cover portion and a securing feature;
inserting the cover plate into a bulk bin that is configured to accommodate storage of bulk components, the bulk bin comprising a first poka-yoke mating feature;
securing the cover plate to the bulk bin via the securing feature to provide that the cover portion extends along and is approximately aligned with an inner surface of the bulk bin to cover the first poka-yoke mating feature; and
engaging the bulk bin with a bin receptacle, such that the first poka-yoke mating feature associated with the bulk bin engages with a second poka-yoke mating feature associated with the bin receptacle.

12. The method of claim 11, wherein fabricating the cover plate comprises:
forming a flat stenciled sheet of a rigid material; and
bending the flat stenciled sheet at a plurality of locations to form the cover portion and the securing feature.

13. The method of claim 11, wherein securing the cover plate to the bulk bin comprises contacting the securing feature with at least one top edge of the bulk bin to allow the cover portion to hang from the at least one top edge of the bulk bin.

14. The method of claim 13, wherein the cover plate further comprises a transition portion that interconnects the cover portion and the securing feature, wherein the securing feature comprises at least one of a lip that extends from the transition portion opposite the cover portion and a pair of opposing tabs that each extend from opposite sides of the transition portion, wherein contacting the securing feature comprises contacting the at least one of the lip and the opposing tabs to the top edge of the bulk bin to secure the cover plate to the top edge of the bulk bin through gravity.

15. The method of claim 11, wherein engaging the bulk bin with the bin receptacle comprises:
resting the bulk bin on a first surface of the bin receptacle, the first surface being approximately horizontal, the bin receptacle further comprising a second surface extending from the first surface at an angle, wherein the second poka-yoke mating feature extends from the second surface; and
sliding the bulk bin along the first surface of the bin receptacle to engage the first poka-yoke mating feature with the second poka-yoke mating feature.

16. A method for producing bulk components, the method comprising:
providing a bulk bin system comprising a first bulk bin and a second bulk bin, the first bulk bin comprising a poka-yoke mating feature extending from an inner surface of the first bulk bin;
securing a cover plate to the first bulk bin, the cover plate comprising a cover portion and a securing feature, the cover portion being approximately aligned with the inner surface of the first bulk bin to cover the poka-yoke feature;
fabricating the bulk components via fabrication equipment;
performing a test on the fabricated bulk components via testing equipment;
determining first condition bulk components in response to a first portion of the fabricated bulk components exhibiting a first response to the test;
determining second condition bulk components in response to a second portion of the fabricated bulk components exhibiting a second response to the test;
providing the first condition bulk components to the first bulk bin of the bulk bin system; and
providing the second condition bulk components to the second bulk bin of the bulk bin system.

17. The method of claim 16, wherein the poka-yoke mating feature is a first poka-yoke mating feature, wherein the method further comprises engaging each of the first and second bulk bins with respective first and second bin receptacles of the bulk bin system, such that the first poka-yoke mating feature associated with the first bulk bin engages with a second poka-yoke mating feature associated with the second bulk bin.

18. The method of claim 16, further comprising fabricating the cover plate, wherein fabricating the cover plate comprises:
forming a flat stenciled sheet of a rigid material; and
bending the flat stenciled sheet at a plurality of locations to form the cover portion and the securing feature.

19. The method of claim 16, wherein fabricating the bulk components comprises fabricating integrated circuits (ICs), wherein performing the test comprises performing at least one electrical performance test on the fabricated ICs, wherein one of the first and second condition bulk components comprises accepted fabricated ICs having passed the at least one electrical performance test and the other of the first and second condition bulk components comprises rejected fabricated ICs having failed the at least one electrical performance test.

20. The method of claim 16, wherein securing the cover plate comprises contacting the securing feature with at least one top edge of the bulk bin to allow the cover portion to hang from the at least one top edge of the bulk bin.

* * * * *